United States Patent [19]

Schrems

[11] Patent Number: 5,516,283
[45] Date of Patent: May 14, 1996

[54] APPARATUS FOR PROCESSING A PLURALITY OF CIRCULAR WAFERS

[75] Inventor: Martin Schrems, Kanagawa, Japan

[73] Assignee: Kabushiki Kaisha Toshiba, Kanagawa, Japan

[21] Appl. No.: 368,817

[22] Filed: Jan. 6, 1995

[30] Foreign Application Priority Data

Mar. 16, 1994 [JP] Japan ................................ 6-044608

[51] Int. Cl.⁶ .................................................. F27D 3/12
[52] U.S. Cl. ............................. 432/241; 432/5; 432/6; 432/152; 432/239; 432/245
[58] Field of Search ........................ 432/5, 6, 83, 152, 432/239, 241, 245

[56] References Cited

U.S. PATENT DOCUMENTS 5,297,956  3/1994  Yamabe et al. .

Primary Examiner—Henry A. Bennet
Assistant Examiner—Siddharth Ohri
Attorney, Agent, or Firm—Finnegan, Henderson, Farabow, Garrett & Dunner

[57] ABSTRACT

An apparatus for processing a plurality of circular wafers including a tubular heater, a boat and a plurality of heat transfer bodies. The tubular heater has a heating space inside and radiates heat within the heating space. The boat is loaded inside the heating space of the tubular heater and holds the wafers in parallel. Heat transfer bodies are located between the wafers.

53 Claims, 16 Drawing Sheets

APPARATUS FOR PROCESSING A PLURALITY OF CIRCULAR WAFERS

FIELD OF THE INVENTION

The present invention relates to an apparatus for processing a plurality of circular wafers, and more particularly, to a thermal processor used for production of semiconductor devices.

BACKGROUND OF THE INVENTION

During thermal processing of materials, the control of the local temperature distribution in the processed bodies is essential. Although application of the basic methods described in this specification may be useful in other fields, the application described herein is directed to achieving temperature uniformity during thermal processing steps in manufacturing microelectronic devices on circular semiconductor wafers.

There is an economically motivated trend of using semiconductor wafers with larger radii. At the same time, the sizes of individual integrated devices are reduced. A significant increase in temperature ramping rates between individual thermal steps is necessary both for economic and technical reasons. At the same time, an ever-increasing temperature uniformity both from wafer to wafer and across the wafer radius is required. However, the increase in wafer size and in temperature ramping rates, both lead to a significant increase in radial temperature non-uniformity in each wafer during manufacture.

During heating, in a commonly used batch-type horizontal or vertical diffusion furnace (conventional furnace), temperature measurements show the lowest temperature occurring at the wafer center, which increases monotonically towards a maximum value, which is observed at the wafer edge.

During cooling down, the reverse effect is observed. Theoretically, this can be explained by the monotonic increase of the geometric factors (view factors) for radiative heat exchange between the wafer and the outside of the inter-wafer region (where the heater elements are located) with decreasing distance from the wafer center.

This situation is shown in FIG. 1. A plurality of semiconductor wafers or wafers 12 are located in parallel with distances of t therebetween. A tubular heater 14 surrounds the wafers 12. The radius of the wafers 12 is r. The area C is an effective heater area of the heater 14, which heats a point X at the distance x ($0 \leq x \leq r$) from the center of one of the wafers 12". The area C includes a first area above R (R is a intersection point of the heater surface and imaginatry extention of wafer 12") which directly heats the upper surface of the semiconductor wafer 12", and a second area below R which directly heats the lower surface of the semiconductor wafer 12". As can be seen, a decrease in x causes a decrease in the area C because of the shadowing effects of the neighboring semiconductor wafers 12' and 12'''. These shadowing effects cause the radial temperature non-uniformity.

In current technology, special wafer-boats with ring-shaped trays placed under each stacked wafer are used. The technology is described in detail in U.S. Pat. No. 5,297,956 (K. Yamabe et. al; Mar. 29, 1994) which is incorporated herein by reference. FIG. 2 shows a cross-sectional view of the ring-shaped trays 17, semiconductor wafers 12, and a boat 13. Typically the ring-shaped tray will be made of quartz or SiC. The effect of the ring is to draw heat from the wafer edge region during temperature ramping (or heating) and to supply heat during the cooling down period, thus compensating the higher rates of temperature change in the edge region compared to the center region of each wafer. The wafer boats with rings were found to significantly improve the temperature non-uniformity during temperature ramping.

However, the additional mass of the ring reduces the temperature ramping-rates on the wafers especially when approaching the holding temperatures. Thus the problem of delay times at the onset of heating or cooling periods and similarly when approaching the holding temperature arises. For achieving the same target ramping rate of the wafer edge, an increase in heater power and/or using a larger wafer spacing is necessary compared to the case of the described conventional wafer boat of FIG. 1. These effects become increasingly disadvantageous with increasing diameter of the wafers to be heat treated.

SUMMARY OF THE INVENTION

Accordingly, it is an object of the present invention to process semiconductor wafers to achieve radial temperature uniformity without the described shortcomings of current technology. It is another object to provide an apparatus for heat treatment of semiconductor wafers with high ramping rates and high cooling rates, and with reduced radial temperature non-uniformity.

More specifically, according to one aspect of the present invention, there is provided an apparatus for processing a plurality of circular wafers including a tubular heater, a boat and a plurality of heat transfer bodies. The tubular heater has an heating space inside and radiates heat within the heating space. The boat is loaded inside the heating space of the tubular heater and holds the wafers in parallel. Heat transfer bodies are inserted between the wafers.

Other objects, features, and advantages of the present invention will become apparent from the following detailed description. It should be understood, however, that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

A more complete appreciation of the present invention and many of its attendant advantages will be readily obtained by reference to the following detailed description considered in connection with the accompanying drawings, in which.

DETAILED DESCRIPTION OF THE PREFERRED EMBODIMENTS

With reference to FIGS. 3, 4, 5, 6 and 7, a first embodiment of the present invention and its variations will be described.

Figure 1:
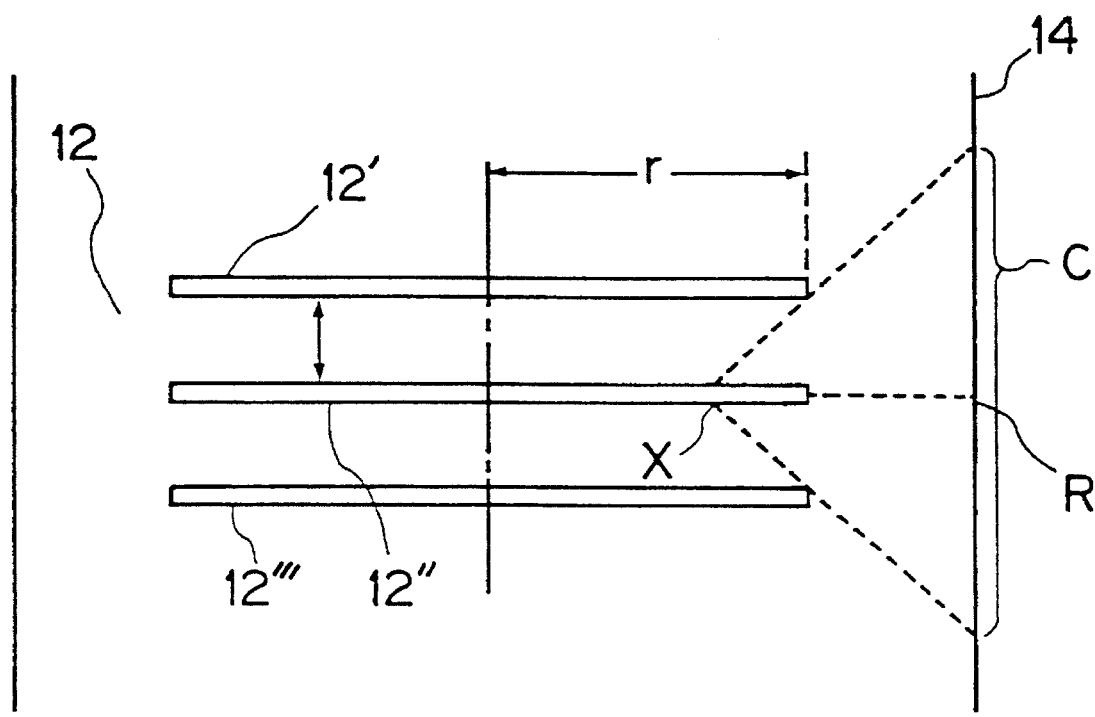
FIG. 1 is a cross-sectional view of a part of a conventional heat treatment apparatus showing how temperature non-uniformity occurs.
Figure 2:
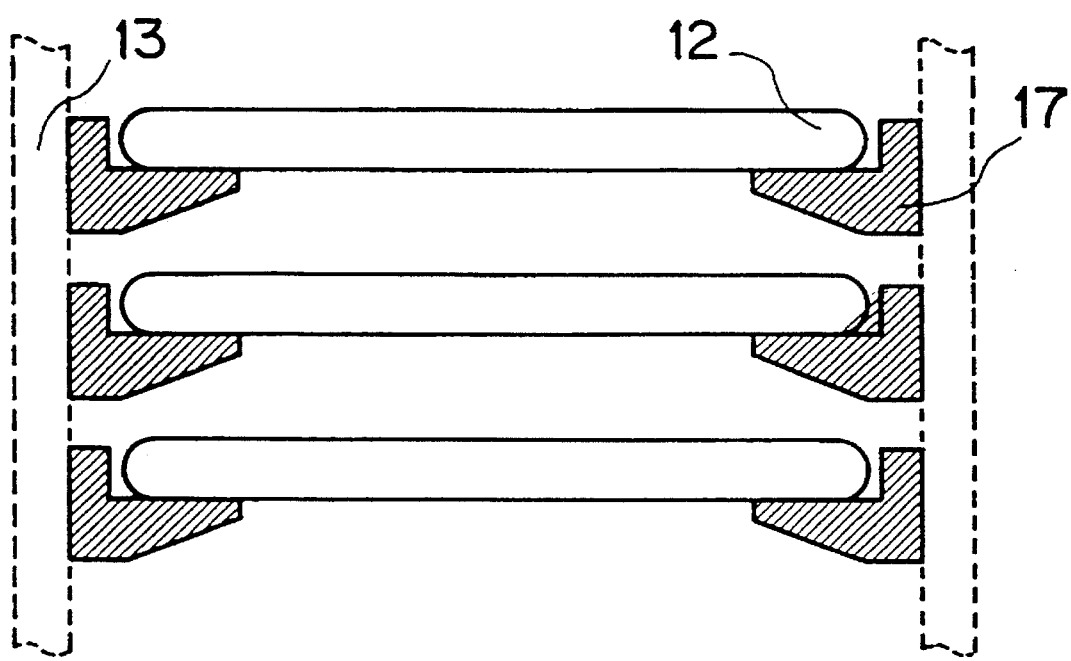
FIG. 2 is a cross-sectional view of a part of a heat treatment apparatus with ring-shaped trays.
Figure 3:
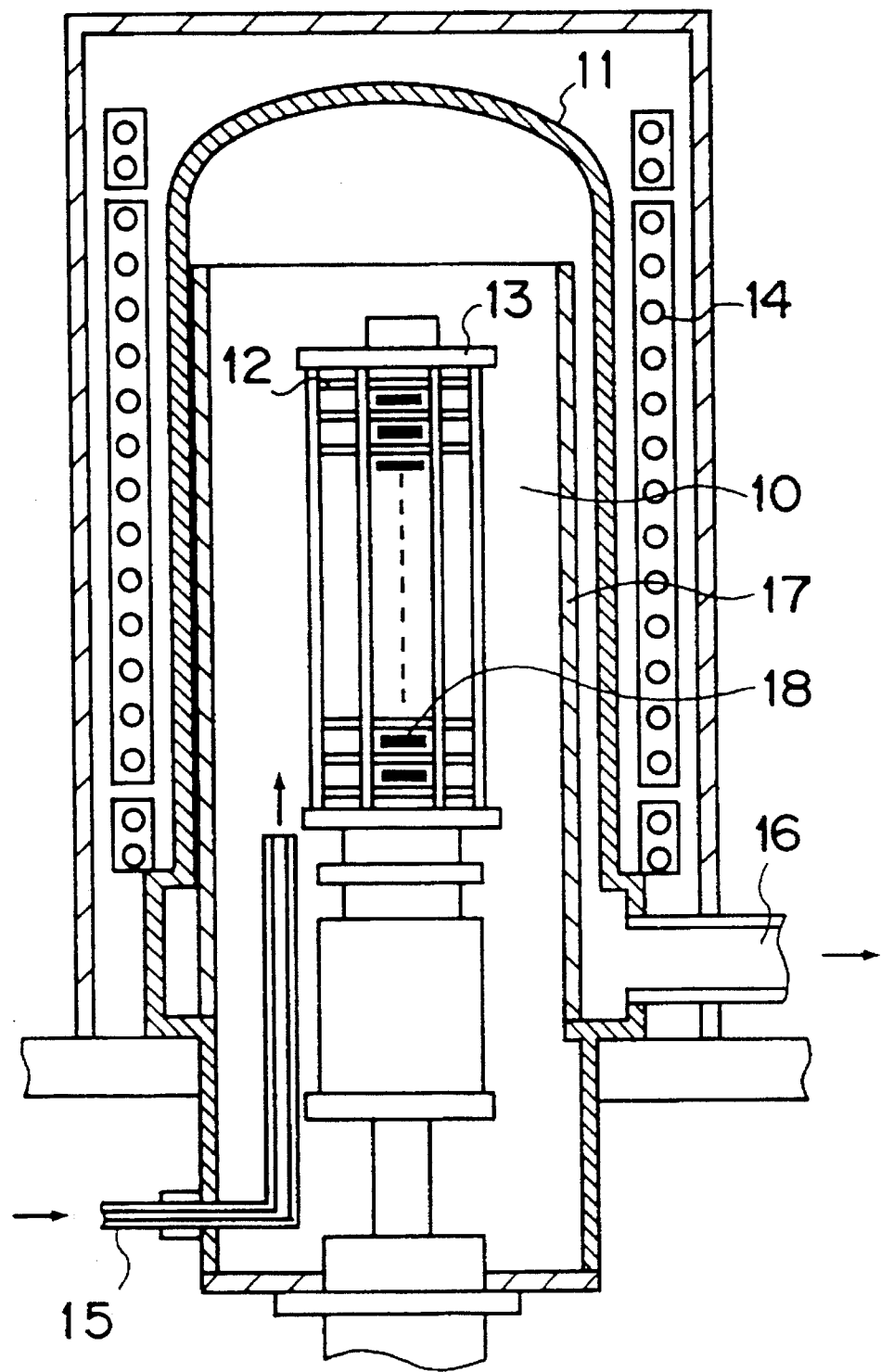
FIG. 3 is a cross-sectional view of a heat treatment apparatus according to the present invention.

FIG. 3 is a cross-sectional view of a heat treatment apparatus according to the present invention. The heat treatment apparatus includes a quartz tube 11, a tubular heater 14, a boat 13, and a plurality of heat transfer bodies (HTBs) 18. The quartz tube 11 defines a process area or heat chamber 10. The tubular heater 14 surrounds the quartz tube 11 and radiates heat within the heat chamber 10. The boat 13 is loaded inside the chamber 10, and holds a plurality of semiconductor wafers 12 in parallel. Each of the HTBs is inserted between the semiconductor wafers 12. The heat treatment apparatus further comprises a mechanism (not shown) for loading and unloading the boat 13 such as load lock system, a gas inlet pipe 15, and a gas outlet pipe 16. A tubular liner 17, composed of quartz is located within quartz tube 11 to direct the flow of gas.

Figure 4:
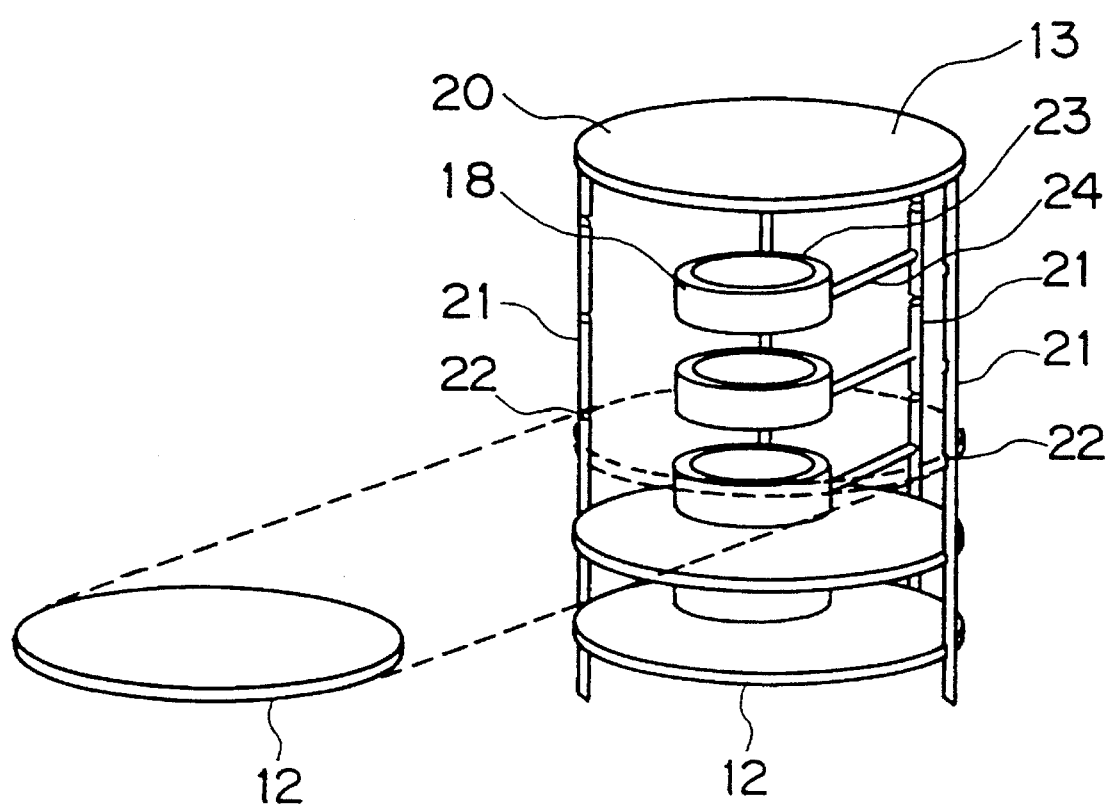
FIG. 4 is a perspective view of a first embodiment of the present invention.

FIG. 4 is a perspective view of a first embodiment of the present invention. The boat 13 includes an upper ceiling 20 and four rods 21 connected to the ceiling 20. The boat is made, for example, of SiC (silicon carbide) or of quartz (or quartz covered with a layer of polysilicon). Tube shaped HTBs 18 are connected to the rods 21 by means of connecting rods 24. The rods 21 have a plurality of graduated notches 22, which are formed at predetermined intervals (e.g., 11 mm intervals), so that a plurality of semiconductor wafers 12 are held in parallel. The notches 22 are so formed that wafers 12 are respectively positioned at a certain distance from the HTBs 23.

Examplary dimensions of the HTB when using semiconductor wafers of 200 mm diameter are as follows: the diameter of the tubular body 23 is 10–100 mm, the height is 2–6 mm, thickness is 0.5–1 mm, and the diameter of the rod 24 is 2–4 mm. The diameter of the tubular body 23 should be smaller than the diameter of the semiconductor wafer 12. These dimensions provide a spacing of about 2–4 mm between each wafer and the adjacent HTB, unless the HTB is attached to the wafer, as more fully described below.

The material used for the HTBs 23 is SiC or quartz covered with polysilicon or any other suitable material with high emissivity and absorptivity for radiation.

The rods 24 may have cross-sections which are circular, triangular, or rectangular and are preferably made from a material with small emissivity, absorptivity and thermal conductivity in order to achieve better temperature uniformity. If only one rod 24 is used, high heating and cooling rates are experienced because of its low heat capacity. If a plurality of rods 24 are used, lower heating and cooling rates are experienced, but a better temperature uniformity and mechanical stability are achieved.

The connecting rod 24 may also be a tube with, for example, an outer diameter of 4 mm, which is more effective because of its smaller heat capacity. When the connecting rods 24 are suitably designed to minimize heat capacity, it is possible to use the same material for the connecting rods 24 as for the HTBs.

Figure 5A:
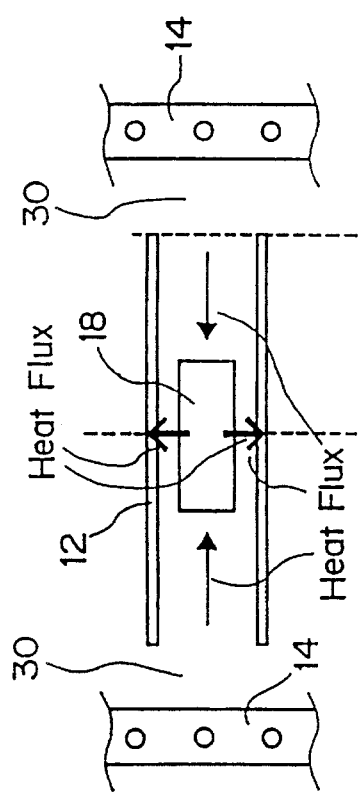
FIG. 5(a) is a cross-sectional view of a part of a heat treatment apparatus according to the first embodiment showing heat flux during ramping.
Figure 5B:
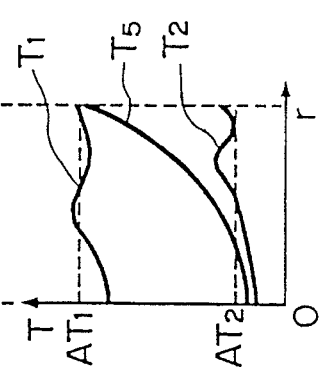
FIG. 5(b) is a graph showing surface temperature distribution of the semiconductor wafer during ramping.
Figure 5C:
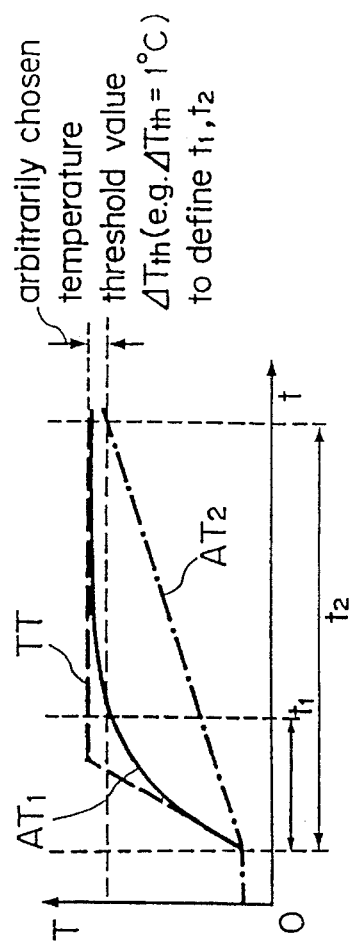
FIG. 5(c) is a graph showing the relationship between target and surface temperatures and process time.

FIG. 5(a) is a cross-sectional view of a heat treatment apparatus according to the first embodiment showing net heat fluxes during ramping. FIG. 5(b) is a graph of surface temperature distribution of a semiconductor wafer during ramping; T1 is the radial temperature distribution with HTBs, T2 is the one with ring-shaped trays, and T5 is with conventional wafer boat. FIG. 5(c) is a graph showing the relationship between the target temperature (plot TT) and surface temperatures (plots AT1 and AT2) and process time t. The time for ramping up is decreased from t2 (with ring-shaped trays) to t1 (with HTBs).

The HTB 18 enhances heat exchange between the wafer center region and the area outside the inter-wafer region, where the heater 14 is located. The exchange of heat radiation between the HTB 18 and the area outside the inter-wafer region predominantly occurs in a direction parallel to the wafers. Heat exchange between the HTB and the near center region of the wafers predominantly occurs in the direction perpendicular to the wafer surface and may be effected by thermal radiation or a combination of thermal conduction and radiation, if the HTB is put in contact with the wafer suface (not shown in FIGS. 5 and 6). Thus the effect of the HTBs is to transfer a heat flux predominantly by radiation and predominantly in a plane parallel to the wafers into a heat flux with the direction perpendicular to the plane and vice versa.

Using appropriately designed HTBs, improvement of the radial temperature uniformity can be achieved compared to using a conventional wafer boat (See FIG. 5(b)). In FIG. 5(b), AT1 and AT2 are average temperatures on the wafer surface using HTBs and using ring-shaped trays, respectively. The heating rate experienced in the apparatus in FIG. 5(a) is higher than in the case of a conventional wafer boat or a boat with ring-shaped trays. (See FIG. 5(c)). In FIG. 5(c), t1 and t2 are times necessary for heating semiconductor wafers using HTBs and using ring-shaped trays, respectively.

During heating, there is a net amount of heat radiation from a region 30 outside the region between the wafers absorbed by the HTBs and transformed into a heat flux toward the wafer center region. The heating rates of inner wafer surface positions are increased compared to the case without HTBs, while the wafer edge heating rate remains almost unchanged. This results in the desired improvement of radial temperature uniformity without lowering the overall heating up rate of the wafer compared to the case when a wafer boat with ring-shaped trays is used.

The above description is applicable to either of the situations of introducing the boat carrying wafers into a preheated heat chamber or heating the chamber after the boat is introduced.

Figure 6A:
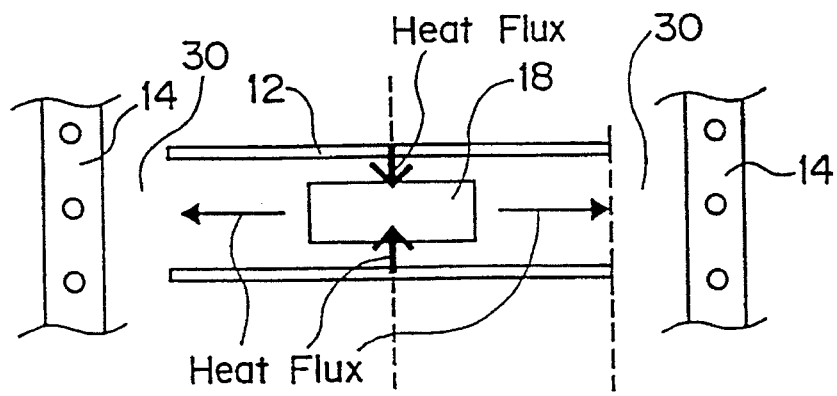
FIG. 6(a) is a cross-sectional view of a part of a heat treatment apparatus according to the first embodiment showing heat flux during cooling.
Figure 6B:
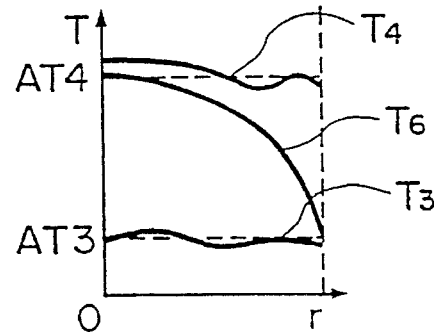
FIG. 6(b) is a graph showing surface temperature distribution of the semiconductor wafer during cooling down.
Figure 6C:
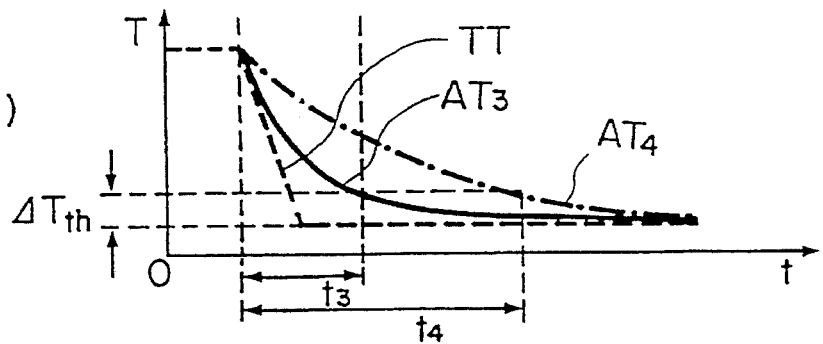
FIG. 6(c) is a graph showing the relationship between target and surface temperatures and process time during cooling down.

FIG. 6(a) is a cross-sectional view of the heat treatment apparatus according to the first embodiment showing the heat flux during cooling down; T3 is the temperature distribution with HTBs, T4 is the one with ring-shaped trays, and T6 is the one with conventional wafer boat. FIG. 6(b) is a graph of the surface temperature distribution of the semiconductor wafer during cooling down, and FIG. 6(c) is a graph showing the relationship between the target temperature (TT) and the average wafer temperatures (AT3 and AT4) and process time during cooling down. The time for cooling is decreased from t4 (with ring-shaped trays) to t3 (with HTBs).

Using appropriately designed HTBs, improvement of the radial temperature uniformity can also be achieved during cooling down, compared to using a conventional wafer boat. (See FIG. 6(b)) The cooling rate is higher than in the case of a conventional wafer boat or a boat with ring-shaped trays (See FIG. 6(c)).

During cooling down, there is a net emission of radiation from the HTBs toward the region 30 inducing an additional heat flow from the wafer center region leading to an increase of the cooling rate of the inner wafer surface positions, while the cooling rate of the wafer edge region remains almost unchanged. This results in the desired improvement of the radial temperature uniformity without lowering the overall cooling rate of the wafer, as in the case when a wafer boat with ring-shaped trays is used.

The above description is applicable to either of the situations of unloading the boat carrying wafers from a heated heat chamber or cooling the chamber while the boat is still inside the chamber.

Figure 7A:
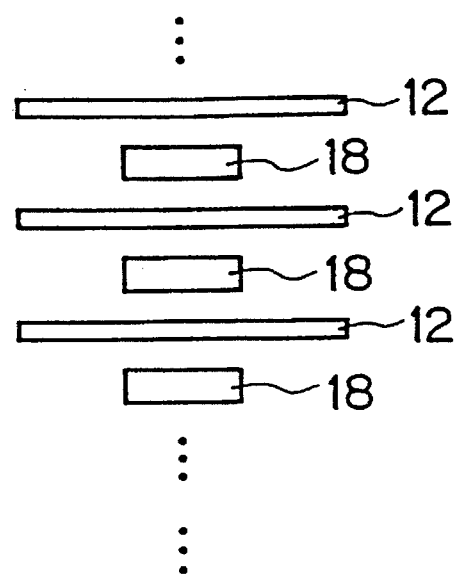
FIGS. 7(a), (b) and (c) are schematic views of stacks of semiconductor wafers and heat transfer bodies.
Figure 7B:
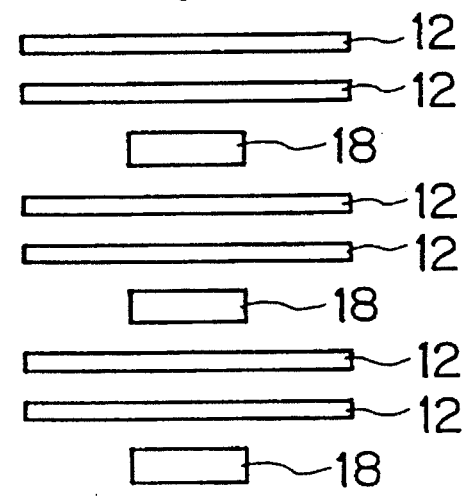
Figure 7C:
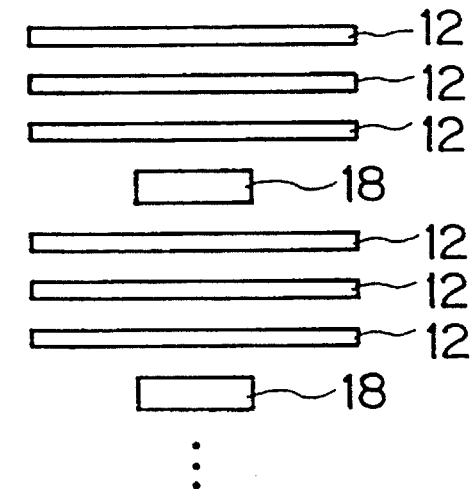

FIGS. 7(a), (b) and (c) are schematic views of stacks of semiconductor wafers and heat transfer bodies. The HTBs 18 are inserted between the semiconductor wafers 12 in FIG. 7(a), so that this arrangement corresponds to the arrangement already described with FIG. 4. The HTBs 18 are inserted between every two semiconductor wafers 12 in FIG. 7(b); The HTBs 18 are inserted between every three semiconductor wafers 12 in FIG. 7(c). If the stacking is done in the manner of FIGS. 7(b) and (c), more wafers can be stacked within a given height. Similarily stacking sequences with more than three wafers in between two neighbouring HTBs may also be used. However, the temperature non-uniformity on the wafers will increase with increasing number of wafers in between the HTBs.

A method for heat processing of semiconductor wafers is as follows: First, a plurality of HTBs 18 and a plurality of semiconductor wafers 12 are stacked to make a wafer stack, with certain distances being kept between the wafers 12 and the HTBs 18; Second, the wafer stack is loaded into the heat chamber 10 of the heater 14; Third, the heater radiates heat within the chamber 10 to heat process the semiconductor wafers 12; Fourth, the wafer stack is unloaded from the chamber 10.

Figure 8A:
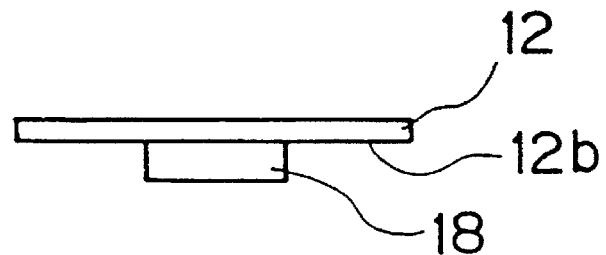
FIGS. 8(a) and (b) are schematic views of further arrangements of a semiconductor wafer and a heat transfer body.
Figure 8B:
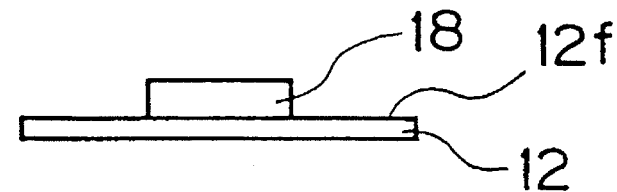

In FIG. 8(a), the HTB 18 is facing a back surface 12b of the wafer 12, and is attached to it. The advantage is that effective heat exchange between the HTB 18 and the wafer 12 is achieved because of the dominant heat transfer of thermal conduction, not of radiation, therebetween, and that mechanical damage to the front surfaces of the wafers, where the devices are grown, is avoided. Furthermore a mechanical support of the inner wafer regions is provided by the HTB 18 in the case of FIG. 8(a). This is particularily important in the case of vertical furnaces and when using wafers with larger diameters such as 300 mm. In this case, the gravitational force will induce large stresses in the wafer which can lead to the formation of slip, if a support like the HTB shown in FIG. 8(a) is not used. In FIG. 8(b), the HTB 18 is facing a front surface 12f of the wafer 12, and is attached to it. The advantage is that effective heat exchange is achieved because of the dominant heat transfer of thermal conduction, and that the alternative of processing the wafers stacked with the front surface pointing in the opposite direction compared to the case of FIG. 8(b) is provided. In addition, in certain cases, connecting rods are not necessary for the arrangement of FIG. 8(b).

The arrangement of FIG. 8(b) is not preferable for heat-treating wafers with larger diameters in a vertical furnace (slip formation), or for film growth or deposition (e.g. CVD furnaces) because a thin film can not be deposited on a contact portion between the surface 12f of the wafer and the HTB, unless the wafers are stacked with the front face directed downwards.

Figure 9:
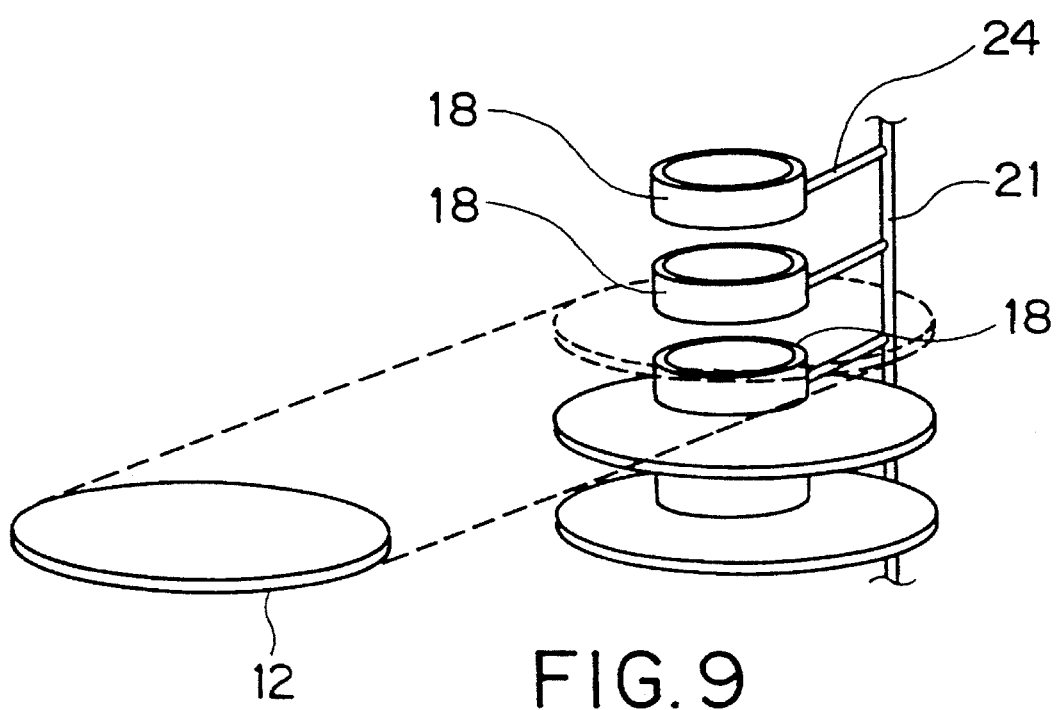
FIG. 9 is a perspective view of a second embodiment of the present invention.

FIG. 9 is a perspective view of a second embodiment of the present invention. The boat includes a rod 21, or a plurality of rods 21, and rods 24. No graduated notches or slits are formed on the rod 21. HTBs 18 are connected to the rods 21 by connecting rods 24. Semiconductor wafers 18 are supported on the HTBs 18, with contacts therebetween. The advantage of the second embodiment is that, potential formation of slip near the contact between wafer and the boat rods 21 is avoided. The main advantage of the embodiment is that the mechanical stress applied to the wafer is reduced because the contact between the wafer and the HTB is circular and not at a point. In addition, if a plurality of rods 21 surround the wafer stack, then a better mechanical stability of the wafer boat and a better temperature uniformity is achieved.

Figure 10A:
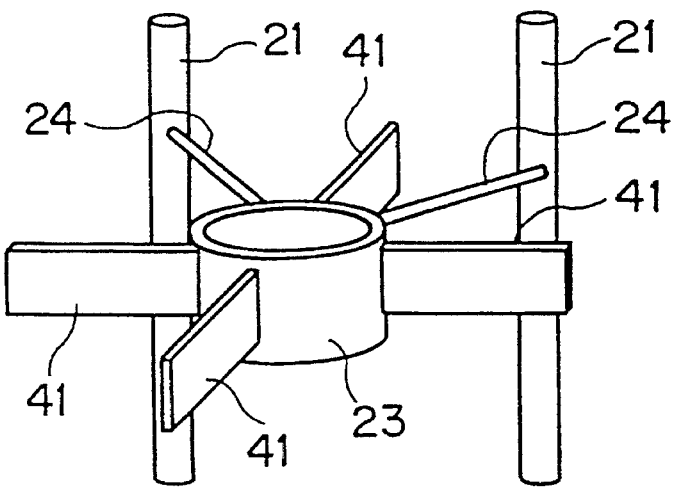
FIGS. 10(a), (b) and (c) are perspective views showing third, fourth and fifth embodiments of the present invention.

FIGS. 10(a), (b) and (c) are perspective views showing third, forth and fifth embodiments of the present invention respectively. The HTB consists of a tubular body 23 and fins 41 of equal length. Examplary dimensions of the fins are: the height is 5 mm, the length is 50–90 mm, and the thickness is 0.5–1 mm. With respect to the tubular body 23, the examplary dimensions described above with respect to FIG. 4 are compatible with the dimensions described here for fins 41. The fins are connected perpendicularly to the surface of the tubular body, and are also perpendicular to the semiconductor wafer 12, which reduces the heat exchange between the wafer 12 and fins 41. The fins collect heat and transfer the heat flux to the tubular body during heating, and radiate heat to the external portion, or region 30, during cooling down.

Figure 10B:
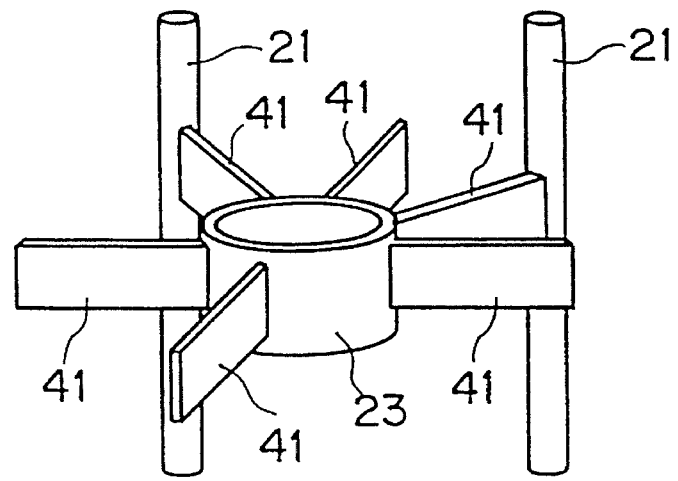

In the arrangement shown in FIG. 10(a), connecting rods are used to connect tubular body 23 to rods 21. However, the arrangement shown in FIG. 10(b), no connecting rods are necessary because the fins 41 are directly connected to the boat rods 21.

Figure 10C:
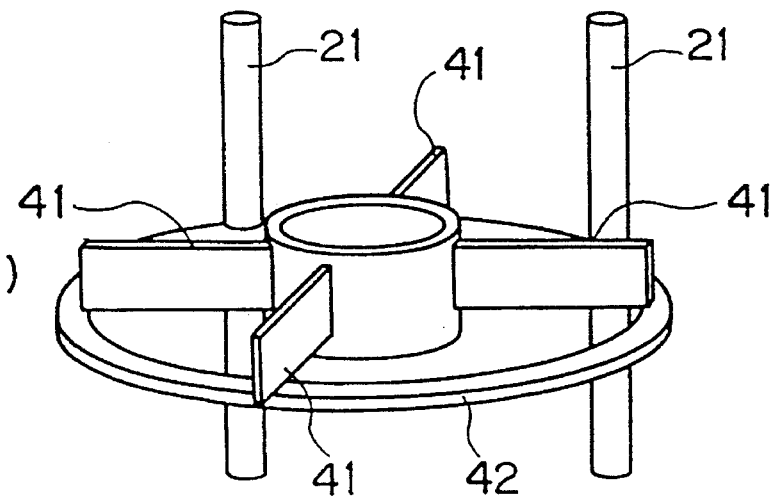

In the arrangement shown in FIG. 10(c), the conventional ring boat can be used, but the ring is not directly attached to the wafer and practically no additional heat mass is added to the wafer edge, so that high ramping and cooling rates result.

Figure 11:
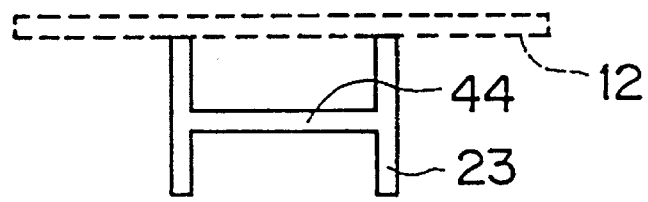
FIGS. 11(a), (b), (c) and (d) are cross-sectional views showing a sixth embodiment of the present invention, and its variations.
Figure 11:
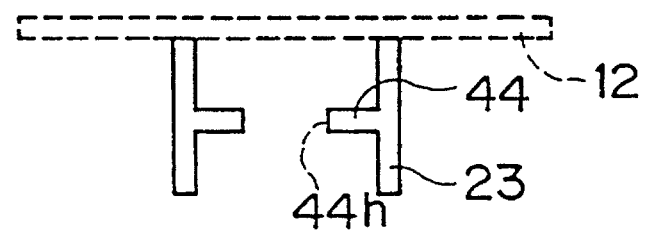
Figure 11:
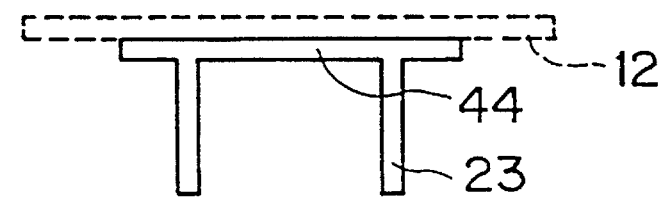
Figure 11:
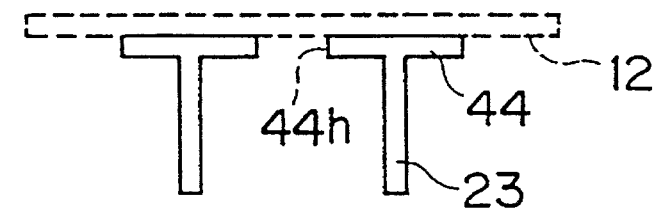

FIGS. 11(a), (b), (c) and (d) are cross-sectional views showing a sixth embodiment of the present invention, and its variations. The HTB consists of a tubular body 23 and a plate 44 facing the wafer 12.

In the arrangements shown in FIGS. 11(a) and (b), the additional plate 44 is facing the wafer at a certain distance (e.g. 3 mm). There is a heat exchange of radiation between wafers and plates, which causes an effective heat transfer during heating and cooling.

In the arrangements shown in FIGS. 11(c) and (d), the additional plate 44 is in contact with the wafer. There is a heat exchange of thermal conduction between the wafer and the plate, which also causes an effective heat transfer during heating and cooling.

In the arrangement shown in FIGS. 11(b) and (d), the plate 44 has a hole 44h at the center, which provides ventilation for an inert gas, or process gas.

Figure 12:
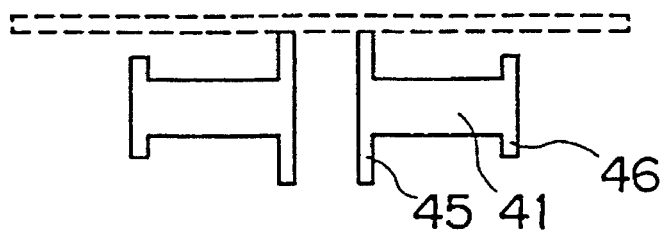
FIGS. 12(a), (b), (c), (d) and (e) are cross-sectional views showing a seventh embodiment of the present invention, and its variations.
Figure 12:
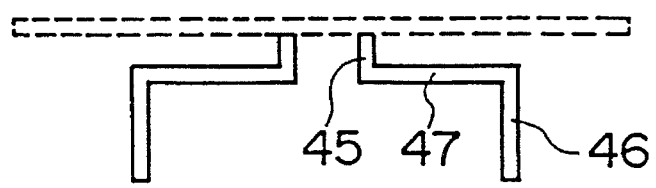
Figure 12:
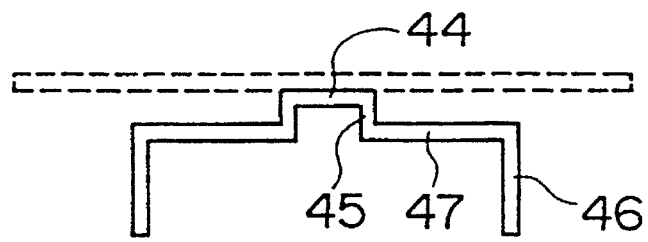
Figure 12:
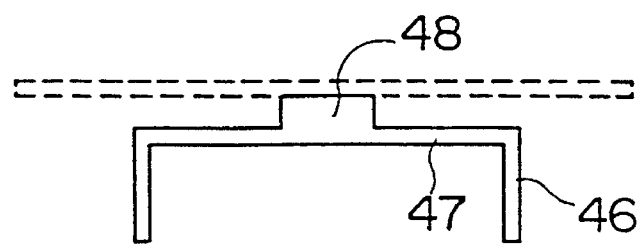
Figure 12:
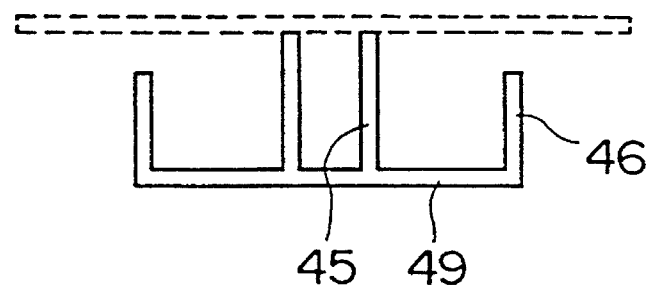

FIGS. 12(a), (b), (c) and (e) are cross-sectional views showing a seventh embodiment of the present invention, and its variations. The HTB consists of a first tubular body 45 and a second tubular body 46, connected by fins 41, or plates 47 and 49. FIG. 12(d) shows a cross-sectional views of a HTB with solid body 48, plate 47, and tubular body 46.

Figure 13:
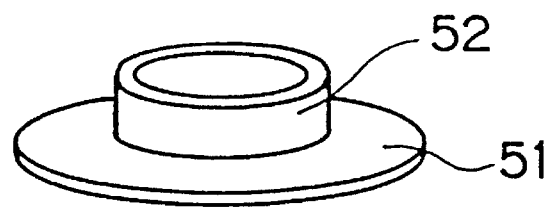
FIGS. 13(a), (b) and (c) are perspective views showing variations of heat transfer bodies.
FIG. 13(d) shows a method of making the HTB of FIG. 13(c).
FIG. 13(e) shows a perspective view of a wafer boat with HTB's of FIG. 13(c) stacked in between the wafer (sequence of FIG. 7(a)) such that each wafer is not only supported by the wafer boat, but also by an HTB.
FIG. 13(f) shows a variation of an HTB using a plate with openings.
Figure 13:
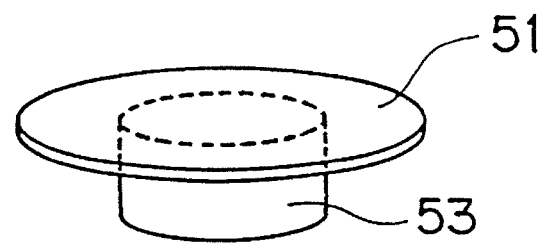
Figure 13:
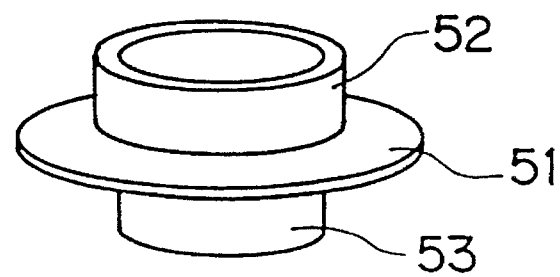
Figure 13:
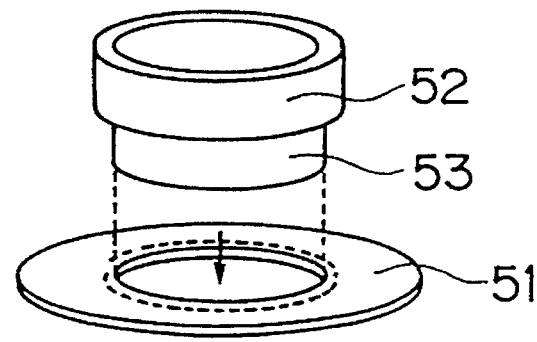

FIGS. 13(a), (b), (c), (d) and (f) are perspective views showing some variations of heat transfer bodies (eigth embodiment of the current invention). In these variations, the HTB consists of a tubular body 52 and a plate 51. This HTB is a dummy wafer which should be inserted between wafers. The conventional wafer boat without rings, and of course without HTB, and with graduated notches can be used for keeping wafers and the HTBs by supporting the plates 51. The diameter and the thickness of the circular plate 51 are similar to those of the semiconductor wafer. The stacking manner is already shown with FIGS. 7(a)–7(c). The material for the dummy wafer, or HTB, can be SiC, quartz, or silicon. FIG. 13(d) shows a way of constructing the HTB of FIG. 13(c), by which welding or using adhesive can be avoided.

Figure 13E:
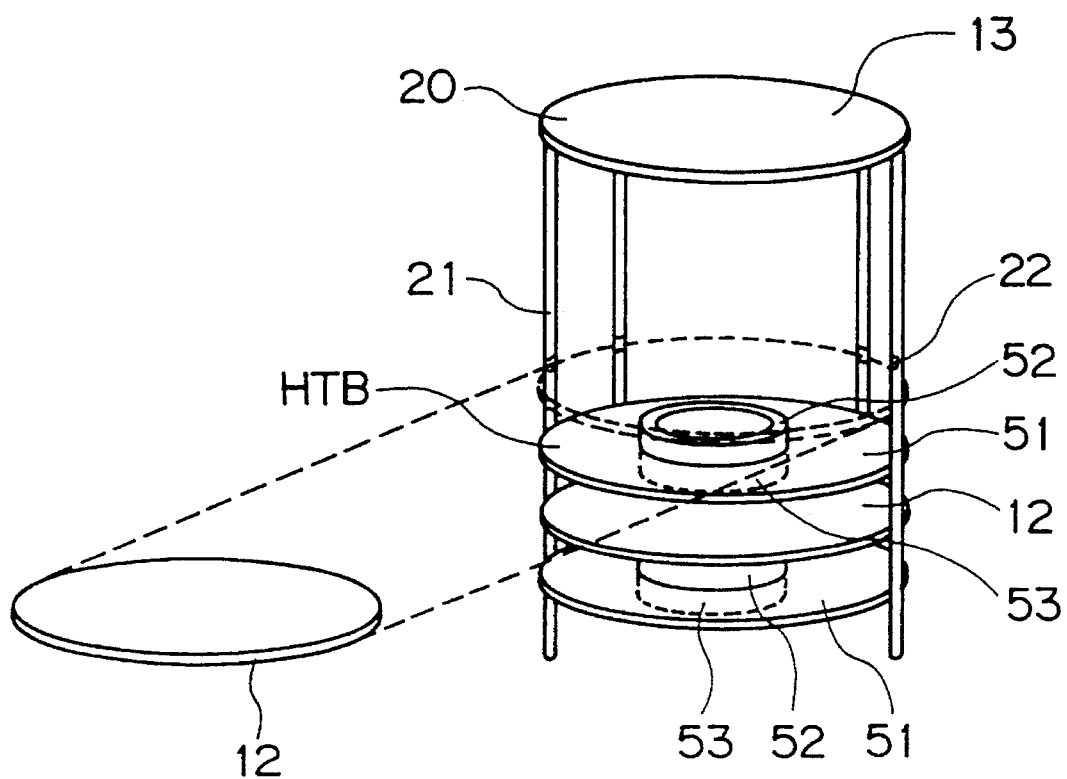
Figure 13E:
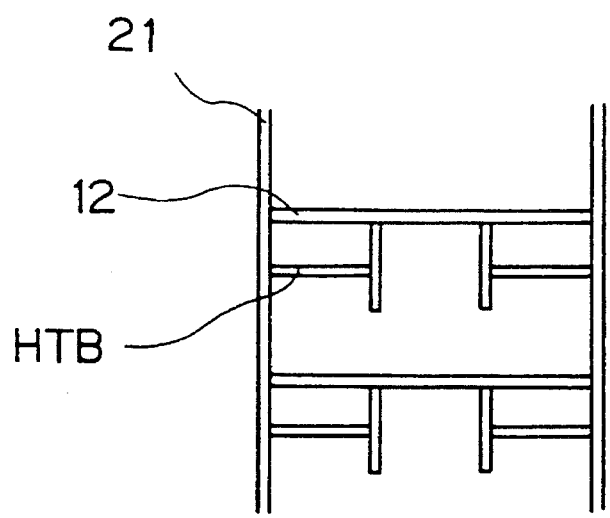
Figure 13F:
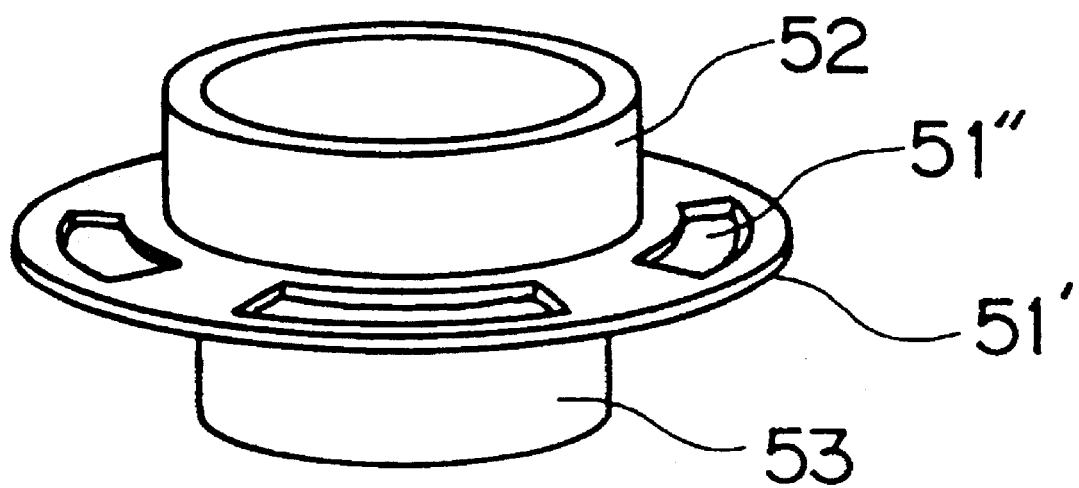

As an example stacking of HTBs from FIG. 13(c) is shown in FIG. 13(e) for the case of using a conventional wafer boat without rings. The HTBs 51,52 and 53 are stacked in between the wafers 12. In case of a vertical furnace, it is favourable to apply the stacking sequence from FIG. 7(a) in such a manner, that each HTB 51, 52 and 53 supports the above wafer. In this way, the HTBs both improve the temperature uniformity and provide additional mechanical support in the inner regions of the wafer, which is especially important for wafers with larger radii such as 200 mm and 300 mm for avoiding slip or warpage. In order to reduce the thermal mass of the HTBs, it is favourable to use plates 51' with openings 51" instead of the plates 51 (FIG. 13(f)).

Figure 14:
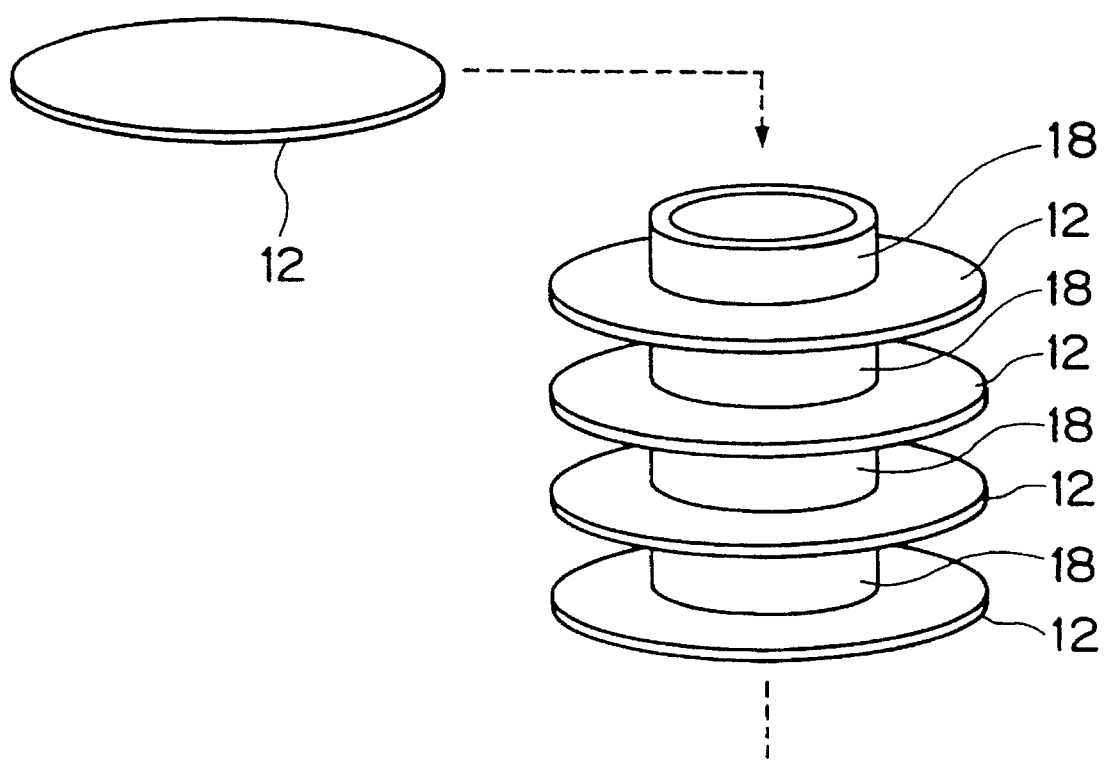
FIG. 14 is a perspective view showing an nineth embodiment of the present invention.

An alternative way of stacking is shown in FIG. 14, which can be performed without using the boat rods 21. Each HTB supports the wafer above it. The tubular body 18 is an HTB, while it also serves as part of a boat. Without rods, a better temperature uniformity can be achieved. The stacking shown in FIG. 14 can be used, e.g., for annealing, but not for growing or depositing film.

According to the embodiments of the present invention described above, the following advantages are achieved:

1) Radial temperature uniformity is achieved by increasing the heating up rate of the wafer center region instead of reducing the heating rate of the wafer edge region. This is achieved by using HTBs.

2) By using HTBs, heating rates are not reduced compared to a similar conventional thermal treatment without using any method for reducing the temperature non-uniformity during heating. Thus the delay times in the beginning and at the end of temperature ramping and the lowering in the overall heating up and cooling down rates, which is a problem of the current technology (wafer boats with ring-shaped trays) can be avoided. This saves processing cost and time compared to the current technology.

3) Some embodiments of the present invention were designed in such a manner, that in addition to improving the temperature uniformity there is also mechanical support provided for the inner regions of the wafer. Compared to the conventional wafer boats with or without ring shaped trays, which only provide mechanical support for positions near the wafer edge, the embodiments of the present invention allow the processing of wafers with large diameters (such as 300 mm) without the formation of slip or warpage.

While HTBs for improving the temperature uniformity and mechanical support during processing of semiconductor wafers have been disclosed, the invention is not so limited. The actual scope of the invention is the procedure of heating and cooling of workpieces, e.g. rectangular wafers for LCDs having rectangular shapes, where the HTB can be an appropriate shape such as rectangular.

Numerous modifications and variations of the present invention are possible in light of the above descriptions. It is therefore to be understood that, within the scope of the appended claims, the present invention can be practiced in a manner other than as specifically described herein.

What is claimed is:

1. An apparatus for processing a plurality of wafers each having a center region, comprising:

a heat chamber;

a heater surrounding said heat chamber for radiating heat toward said heat chamber;

a wafer supporting means for loading into said heat chamber and for supporting the plurality of wafers; and a heat transfer body for mounting between adjacent one of the wafers for exchanging heat with the center regions of the wafers.

2. The apparatus according to claim 1, wherein said heat transfer body includes means for promoting heat exchange with an outer marginal portion of said plurality of wafers.

3. The apparatus according to claim 1, wherein said heat transfer body is mounted in spaced relationship to the adjacent wafers.

4. The apparatus according to claim 1, wherein said heat transfer body is mounted in contact with one of the adjacent wafers.

5. An apparatus for processing a plurality of wafers each having a center region, comprising:

a heat chamber;

a heater surrounding said heat chamber for radiating heat toward said heat chamber;

a plurality of heat transfer bodies arranged in parallel and loaded into said heat chamber, for respectively surpporting the wafers in parallel and for exchanging heat with the center regions of the wafers.

6. The apparatus according to claim 5, wherein each of said heat transfer bodies includes means for exchanging heat with an outer marginal portion of the plurality of wafers.

7. The apparatus according to claim 5, wherein each of said heat transfer bodies exchange heat with said center region of said wafers predominantly by way of thermal conduction.

8. An apparatus for processing a plurality of circular wafers comprising:
   a tubular heater having an inner region, for radiating heat toward said inner region;
   a boat for loading into said inner region and for holding the plurality of wafers in parallel; and
   a plurality of heat transfer bodies respectively mounted for positioning between the wafers.

9. The apparatus according to claim 8, wherein each of said heat transfer bodies comprises a tubular body with an outer surface facing said tubular heater and an edge surface facing a proximate one of the wafers.

10. The apparatus according to claim 9, wherein a diameter of said tubular body is smaller than a diameter of the wafer.

11. The apparatus according to claim 9, wherein each of said heat transfer bodies further comprises a plurality of fins extending toward said tubular heater.

12. The apparatus according to claim 9, wherein said boat comprises a plurality of parallel rods with a plurality of notches formed at a predetermined intervals, and further comprising connecting rods for connecting said heat transfer bodies to said rods.

13. The apparatus according to claim 9, wherein said boat comprises a rod and a connecting rod for connecting said heat transfer bodies to said rod.

14. The apparatus according to claim 11, wherein said boat comprises a rod and at least one of said fins being connected to said rods.

15. The apparatus according to claim 11, wherein said boat comprises a rod and a plurality of ring-shaped trays connected to said rod, said ring-shaped trays supporting said heat transfer bodies.

16. The apparatus according to claim 8, wherein each of said heat transfer bodies comprises a tubular body with an outer surface facing said tubular heater and an edge surface facing a proximate one of the wafers and a plate connected to said tubular body to face of the proximate wafer.

17. The apparatus according to claim 8, wherein each of said heat transfer bodies is positioned to be spaced a predetermined distance from the wafers.

18. The apparatus according to claim 9, wherein each of said heat transfer bodies is attached to one of the wafers 19. The apparatus according to claim 11, wherein said fins are so connected to said tubular body to be perpendicular to the wafers.

20. The apparatus according to claim 8, wherein each of said heat transfer body is made of SiC.

21. The apparatus according to claim 8, wherein each of said heat transfer body is made of quartz covered by a polysilicon film.

22. The apparatus according to claim 8, wherein each of said heat transfer body is made of silicon.

23. The apparatus according to claim 11, wherein said fins are made of SiC.

24. The apparatus according to claim 11, wherein said fins are made of quartz covered by a polysilicon film.

25. The apparatus according to claim 11, wherein said fins are made of silicon.

26. An apparatus for processing a plurality of wafers each having a center region, comprising:
   a heat chamber;
   a heater surrounding said heat chamber for radiating heat toward said heat chamber;
   a wafer supporting means for loading into said heat chamber, for supporting the plurality of wafers; and
   a heat transfer body connected to said wafer supporting means.

27. The apparatus according to claim 26, wherein said heat transfer body includes means for promoting heat exchange with an outer marginal portion of said plurality of wafers.

28. The apparatus according to claim 26, wherein said heat transfer body is mounted in spaced relationship to the adjacent wafers.

29. The apparatus according to claim 26, wherein each of said heat transfer body is mounted in contact with one of the adjacent wafers.

30. A wafer boat for carrying a plurality of wafers and for loading into a wafer processing heat chamber surrounded by a heater, comprising;
   wafer supporting means for supporting the plurality of wafers; and
   a heat transfer body connected to said wafer supporting means for exchanging heat with center region of one of the plurality of wafers.

31. The wafer boat according to claim 30, wherein said heat transfer body is a tubular body and a diameter of said tubular body is smaller than a diameter of the wafer.

32. The wafer boat according to claim 31, wherein said heat transfer body further comprises a plurality of fins extending toward said tubular heater.

33. The wafer boat according to claim 31, wherein said heat transfer body is positioned to be spaced a predetermined distance from the wafers.

34. The wafer boat according to claim 31, wherein said heat transfer body is in contact with one of the wafers 35. The wafer boat according to claim 31, wherein said heat transfer body is made of SiC.

36. The wafer boat according to claim 31, wherein said heat transfer body is made of quartz covered with poly silicon.

37. The wafer boat according to claim 31, wherein said heat transfer body is made of silicon.

38. A dummy wafer inserted between a plurality of circular wafers and held by a wafer boat comprising:
   a circular plate having a diameter similar to the circular wafers; and
   a tubular body connected perpendicularly to said circular plate.

39. The dummy wafer according to claim 38, wherein said tubular body has an upper body connected to a front side of said circular plate and a lower body connected to a backside of said circular plate.

40. The dummy wafer according to claim 39, wherein the diameter of said upper body is larger than the diameter of said lower body and said circular plate has a hole of a diameter the same as the diameter of said lower body.

41. The dummy wafer according to claim 38, wherein said tubular body and said circular plate are made from SiC.

42. The dummy wafer according to claim 38, wherein said tubular body and said circular plate are made from quartz covered with polysilicon.

43. The dummy wafer according to claim 38, wherein said tubular body and said circular plate are made from silicon.

44. The dummy wafer according to claim 38, wherein said tubular body is made from SiC and said circular plate is made from quartz.

45. The dummy wafer according to claim 38, wherein said tubular body is made from quartz covered with a layer of polysilicon and said circular plate is made from quartz.

46. The dummy wafer according to claim 38, wherein said tubular body is made from silicon and said circular plate is made from quartz.

47. The dummy wafer according to claim 38, wherein said circular plate has an opening for reducing the thermal mass of the dummy wafer.

48. A method for heat processing a plurality of wafers each having a center region comprising the steps of:

forming a stack of said plurality of wafers and a plurality of heat transfer bodies, the stack having an axis;

radiating heat toward the axis to heat said heat transfer bodies and wafers; and exchanging heat between said heat transfer bodies and said center regions of said wafers;

49. A method for heat processing a plurality of wafers comprising the steps of:

stacking a plurality of heat transfer bodies and a plurality of said wafers to make a wafer stack;

loading said wafer stack into a heating space of a tubular heater;

radiating heat within said heating space; and unloading said wafer stack from said tubular heater.

50. The method according to claim 49, wherein said plurality of heat transfer bodies and said plurality of said circular wafers are stacked in a manner that certain distances are kept between said circular wafers and said heat transfer bodies.

51. The method according to claim 49, wherein said plurality of heat transfer bodies and said plurality of said circular wafers are stacked in a manner that said wafers are attached to said heat transfer bodies.

52. The method according to claim 49, wherein said plurality of heat transfer bodies and said plurality of said circular wafers are stacked in a manner that each of said heat transfer bodies is inserted between every two circular wafers.

53. The method according to claim 49, wherein said heat transfer bodies and said circular wafers are stacked in a manner that each heat transfer body is inserted between every three circular wafers.

* * * * *

UNITED STATES PATENT AND TRADEMARK OFFICE
CERTIFICATE OF CORRECTION

PATENT NO. : 5,516,283
DATED : May 14, 1996
INVENTOR(S) : Martin SCHREMS

It is certified that error appears in the above-indentified patent and that said Letters Patent is hereby corrected as shown below:

Claim 5, column 8, lines 62 and 63, "surpporting" should read --supporting--.

Claim 12, column 9, line 25, before "predetermined", delete "a".

Claim 18, column 9, line 46, after "wafers" insert --.--.

Claim 34, column 10, line 33, after "wafers" insert --.--.

UNITED STATES PATENT AND TRADEMARK OFFICE
CERTIFICATE OF CORRECTION

PATENT NO. : 5,516,283
DATED : May 14, 1996
INVENTOR(S) : Martin SCHREMS

It is certified that error appears in the above-indentified patent and that said Letters Patent is hereby corrected as shown below:

Claim 36, column 10, lines 37 and 38, "poly silicon" should read --polysilicon--.

Signed and Sealed this

Eighteenth Day of February, 1997

Attest:

BRUCE LEHMAN

*Attesting Officer*   *Commissioner of Patents and Trademarks*